US010811167B2

(12) United States Patent
Poppe et al.

(10) Patent No.: US 10,811,167 B2
(45) Date of Patent: Oct. 20, 2020

(54) HIGH-VOLTAGE CABLE

(71) Applicant: Dürr Systems GmbH, Bietigheim-Bissingen (DE)

(72) Inventors: Siegfried Poppe, Markgröningen-Unterriexingen (DE); Heiko Kamp, Freiberg a. N. (DE)

(73) Assignee: DÜRR SYSTEMS AG, Bietgheim-Bissingen (DE)

(*) Notice: Subject to any disclaimer, the term of this patent is extended or adjusted under 35 U.S.C. 154(b) by 0 days.

(21) Appl. No.: 15/115,361

(22) PCT Filed: Jan. 9, 2015

(86) PCT No.: PCT/EP2015/000030
§ 371 (c)(1),
(2) Date: Jul. 29, 2016

(87) PCT Pub. No.: WO2015/113729
PCT Pub. Date: Aug. 6, 2015

(65) Prior Publication Data

US 2017/0011819 A1 Jan. 12, 2017

(30) Foreign Application Priority Data

Jan. 30, 2014 (DE) .................... 20 2014 100 412 U
Jul. 21, 2014 (DE) ........................ 10 2014 010 777

(51) Int. Cl.
*H01B 9/02* (2006.01)
*H01B 7/00* (2006.01)
(Continued)

(52) U.S. Cl.
CPC ......... *H01B 7/0054* (2013.01); *H01B 7/0009* (2013.01); *H01B 7/18* (2013.01);
(Continued)

(58) Field of Classification Search
CPC ......... H01R 13/035; H01B 9/027; H01B 5/08
(Continued)

(56) References Cited

U.S. PATENT DOCUMENTS 2,703,356 A * 3/1955 Buchanan ................ H01B 1/00 338/211
2,790,053 A * 4/1957 Peterson ............. H01B 7/0063 174/102 R
(Continued)

FOREIGN PATENT DOCUMENTS

CN 101714436 A 5/2010
CN 103534763 A 1/2014
(Continued)

OTHER PUBLICATIONS

International Search Report and Written Opinion for PCT/EP2015/000030 dated Mar. 11, 2015 (with English translation; 11 pages).
(Continued)

*Primary Examiner* — Chau N Nguyen
(74) *Attorney, Agent, or Firm* — Beijin Bieneman PLC

(57) ABSTRACT

A high-voltage cable for electrostatically charging a coating agent in an electrostatic coating plant is provided. The cable includes a centrally arranged cable core and an electrically insulating jacket which sheaths the cable core. The cable core has a moderate electrical resistance according to the principles of the present disclosure. The cable core includes fibers that form a non-woven fabric, and at least one strip of the non-woven fabric of the cable core is twisted.

12 Claims, 4 Drawing Sheets

(51) Int. Cl.

| | |
|---|---|
| ***H01B 7/18*** | (2006.01) |
| *H01B 7/28* | (2006.01) |
| *H01B 7/282* | (2006.01) |
| *H01B 7/295* | (2006.01) |

(52) U.S. Cl.
CPC ................ *H01B 7/28* (2013.01); *H01B 7/282* (2013.01); *H01B 7/295* (2013.01)

(58) Field of Classification Search
USPC ... 174/126.4, 110 SC, 106 R, 128.1, 120 SC
See application file for complete search history.

(56) References Cited

U.S. PATENT DOCUMENTS

| | | | | | |
|---|---|---|---|---|---|
| 3,792,409 | A * | 2/1974 | Smart | H01B 7/0054 | 338/214 |
| 4,185,164 | A * | 1/1980 | Frosch | H01B 17/42 | 174/142 |
| 4,576,827 | A * | 3/1986 | Hastings | B05B 5/001 | 239/3 |
| 4,739,935 | A * | 4/1988 | Hastings | H01T 19/04 | 174/102 SC |
| 4,988,949 | A * | 1/1991 | Boenning | G01R 31/021 | 174/115 |
| 5,171,938 | A * | 12/1992 | Katsumata | H01B 7/08 | 174/105 SC |
| 7,665,451 | B2 * | 2/2010 | Lam | H01B 7/0063 | 123/604 |
| 2002/0129969 | A1 * | 9/2002 | Groegl | H01B 7/041 | 174/128.1 |
| 2010/0084159 | A1 | 4/2010 | Drew et al. | | |

FOREIGN PATENT DOCUMENTS

| | | | |
|---|---|---|---|
| DE | 19637472 | A1 | 3/1998 |
| EP | 0829883 | A2 | 3/1998 |
| JP | S50-000381 | A | 1/1975 |
| JP | 2003-036737 | A | 2/2003 |
| WO | 2012142129 | A1 | 10/2012 |

OTHER PUBLICATIONS

English translation of Notification of Reasons for Rejection for Application No. JP2016-549502 dated Dec. 18, 2018 (4 pages).

* cited by examiner

HIGH-VOLTAGE CABLE

CROSS-REFERENCE TO RELATED APPLICATIONS

This application is a national stage of, and claims priority to, Patent Cooperation Treaty Application No. PCT/EP2015/000030, filed on Jan. 9, 2015, which claims priority to German Application No. DE 20 2014 100 412.2 filed on Jan. 30, 2014 and German Application No. DE 10 2014 010 777.9 filed on Jul. 21, 2014, each of which applications are hereby incorporated herein by reference in their entireties.

BACKGROUND

The disclosure relates to a high-voltage cable for, e.g., electrostatically charging a coating agent in a coating plant.

FIG. 1 shows a conventional high-voltage cable 1A comprising a cable core 2A made of stranded copper wire or copper wires, a field-smoothing element 3A that sheaths the cable core 2A and is made of polyolefin that has been made electrically conductive, an insulating jacket 4A that sheaths the field-smoothing element 3A and is made of electrically insulating polyolefin, and an outer jacket 5A made of polyurethane (PU), which outer jacket 5A in addition to additional electrical insulation ensures that the high-voltage cable 1A is sufficiently resistant to wear and chemicals.

The disadvantage with such a known high-voltage cable 1A described above, for, e.g., electrostatically charging a coating agent in a coating plant, is the very low electrical resistance, which stems from the fact that the cable core 2A is made of copper, which has a very low electrical resistivity. For example, when such a high-voltage cable is used in an electrostatic coating plant, the low electrical resistance of the high-voltage cable 1A can result in severe current oscillations during a discharge, which is undesirable.

FIG. 2 shows another known high-voltage cable 1B, as described in EP 0 829 883 A2. This high-voltage cable 1B corresponds in part to the high-voltage cable 1A described above and depicted in FIG. 1, and therefore to avoid repetition, reference is made to the above description, with the similarly numbered reference signs being used for corresponding features.

A distinct feature of this high-voltage cable 1B is that the insulating jacket consists of two coaxial layers 4.1B, 4.2B lying one above the other in the radial direction.

Another feature of this known high-voltage cable 1B is that the cable core 2B is made of an electrically insulating plastics material (e.g. polyester) and therefore does not conduct current. The electrically insulating cable core 2B in the form of a fiber acts here as a mechanical support for a conductor layer 6B, which may, for example, be made of polyethylene (PE) filled with carbon particulates. The conductor layer 6B, however, has a far higher electrical resistance than the conductive cable core 2A made of copper shown in FIG. 1. This is advantageous because the high-voltage cable 1B shown in FIG. 2 thus has a higher electrical resistance, and hence when used in an electrostatic coating plant, the unwanted current oscillations arising during discharge processes are attenuated.

The disadvantage with the high-voltage cable 1B shown in FIG. 2, however, is the fact that on contact with petroleum jelly or insulating oils (e.g. transformer oil), the electrical conductivity can drop away. Packing with petroleum jelly is a standard approach in conventional connectors for high-voltage cables. This petroleum jelly can permeate from the cable ends of the high-voltage cable 1B into the high-voltage cable 1B, and the high-voltage cable 1B may become saturated with petroleum jelly from the cable end as a result of, e.g., capillary action. The permeating petroleum jelly causes the conductor layer 6B to become electrically insulating because of the petroleum jelly diffusing into said layer, thereby making the high-voltage cable 1B unusable.

SUMMARY

The present disclosure is directed toward an improved high-voltage cable, which in particular is suitable for use in an electrostatic coating plant.

For example, when the high-voltage cable according to the disclosure is used in an electrostatic coating plant, it attenuates the unwanted current oscillations that can arise during charging and discharging processes when the known high-voltage cable 1A as shown in FIG. 1 is used.

In another example, the high-voltage cable according to the disclosure also prevents the electrical conductivity being affected or from dropping away as a result of contact with petroleum jelly or insulating oils (e.g. transformer oil).

According to the principles of the present disclosure, a high-voltage cable comprises a centrally arranged cable core surrounded by an electrically insulating jacket, and the cable core has a moderate electrical resistance.

Unlike the known high-voltage cable 1A shown in FIG. 1, the cable core according to the principles of the present disclosure is thus not highly electrically conductive, thereby preventing unwanted current oscillations during charging and discharging processes.

Unlike the conventional high-voltage cable 1B shown in FIG. 2, the high-voltage cable according to the principles of the present disclosure has a structure that inhibits susceptibility to petroleum jelly or insulating oils and therefore may substantially maintain its electrical resistance.

It should be understood that, as used herein, the term "a moderate electrical resistance" is relative to the distinction with an electrical conductor (e.g. copper) on the one hand and an electrical insulator on the other hand, and, therefore, has the meaning that the electrical resistance per unit length of the high-voltage cable according to the principles of the present disclosure with a moderate electrical resistance is in the range of, e.g., 1 kΩ/m-1MΩ/m, 2 kΩ/m-500 kΩ/m, 5 kΩ/m-200 kΩ/m or 10 kΩ/m-50 kΩ/m. Accordingly, a moderate electrical resistance of the conductive cable core according to the principles of the present disclosure is in a range that is suitable for use in an electrostatic coating plant for electrostatically charging a coating agent.

In one exemplary embodiment of the disclosure, the cable core consists of twisted strips of nonwoven fabric, which in turn are composed of a plurality of filaments and are themselves electrically conductive or are made electrically conductive. In this case a single strip of nonwoven fabric can be twisted and can then form the cable core. In other embodiments, it is possible that a plurality of nonwoven-fabric strips are twisted in a plurality of strands and then form the cable core.

In some embodiments of the disclosure, the individual fibers or filaments of the nonwoven-fabric strips are made of an electrically conductive plastics material, for instance are made of polyethylene (PE), which is filled with carbon particulates, as described in EP 0 829 883 A2.

In another embodiment of the disclosure, the individual fibers of the nonwoven-fabric strip are o made of an electrically insulating plastics material that is made electrically conductive by a surface coating containing an electrically conductive material.

In another exemplary embodiment of the disclosure, the cable core comprises a film that either is itself electrically conductive or is coated with an electrically conductive layer.

As mentioned above, with conventional high-voltage cables, permeating petroleum jelly can result in the electrical conductivity dropping away. The disclosure addresses this unwanted effect in multiple ways.

In one example, the cable core is made of such coarse fibers that the gaps between the individual fibers of the cable core are so large that substantially any capillary force is not sufficient to draw petroleum jelly into the gaps. Thus this prevents any petroleum jelly at all permeating into the high-voltage cable according to the disclosure.

In another example, the permeation of petroleum jelly into the high-voltage cable can also be prevented by minimizing and/or substantially eliminating the gaps between the fibers of the cable core, so that the cable core cannot draw up any petroleum jelly at all. For example, the nonwoven-fabric strips of the cable core can be twisted so tightly that the gaps between the individual fibers are excluded almost entirely. There is also, e.g., an alternative option of filling the gaps between the fibers of the cable core in order to prevent petroleum jelly being able to permeate into the gaps.

In some embodiments, the electrically conductive cable core in the high-voltage cable according to the disclosure can be surrounded by a "field-smoothing element" as already known from the prior art. Such a field-smoothing element can be made of an electrically conductive plastics material, for example, as known from EP 0 829 863 A2. In some embodiments, the field-smoothing element also has a moderate resistance, where the meaning of this term has already been explained above. In such embodiments, the electrical resistance of the field-smoothing element is greater than the electrical resistance of the cable core, in order to be able to achieve field-smoothing, but less than the electrical resistance of the insulating jacket. The field-smoothing element is arranged between the cable core and the insulating jacket, as already known from the prior art. In exemplary embodiments, the field-smoothing element lies directly on the cable core or on the conductive coating of the cable core without any intermediate layer.

In addition, in some embodiments, the high-voltage cable according to the disclosure, may comprise a shield for electrically shielding the high-voltage cable, which shield is of low resistance. For example, the shield can be made of braided copper wire or of a combination of a braided copper wire with a plastics material. In exemplary embodiments, the resistance of the shield is less than the resistance of the cable core and of the field-smoothing element.

It should be understood that the breakdown strength of the high-voltage cable depends, among other factors, on the field distribution inside the high-voltage cable. Thus the field strength should be as small as possible at the conductor layer. The field strength depends on the ratio of the diameter dA of the shield with respect to the diameter dS of the cable core. The diameter ratio dA/dS is, in some exemplary embodiments, in the range of, e.g., 1.5 to 5, 2 to 4 or 2 to 3.4.

Finally, the high-voltage cable according to the disclosure, may also comprise an electrically insulating outer jacket, which outer jacket can be made of a plastics material, for instance, in particular is made of polyurethane (PU). Compared with the insulating jacket, the outer jacket may have, e.g., a greater mechanical wear resistance, be of lower flammability and/or be more resistant to acid.

A high-voltage cable according to the principles of the present disclosure has, in exemplary embodiments, a sufficient dielectric strength for use in an electrostatic coating plant. Therefore, in exemplary embodiments, the dielectric strength of the high-voltage cable is at least, e.g., 1 kV, 2 kV, 5 kV, 10 kV, 20 kV, 50 kV, 100 kV or 150 kV.

A high-voltage cable according to the principles of the present disclosure, in exemplary embodiments, has an electrical capacitance to allow use in an electrostatic coating plant. The electrical capacitance of the high-voltage cable therefore, in exemplary embodiments, is in the range of, e.g., 1 pF/m-1000 pF/m, 10 pF/m-500 pF/m, 20 pF/m-250 pF/m, 50 pF/m-100 pF/m or 70 pF/m-100 pF/m.

In addition, according to the principles of the present disclosure, in some exemplary embodiments, the cable core of moderate electrical conductivity can be surrounded electrically by the field-smoothing element at junctions along the high-voltage cable, as shown in FIG. 6. Such junctions do not extend over the entire length of the high-voltage cable but only extend over discrete points or sections of the cable.

The electrical contact with the high-voltage cable according to the principles of the present disclosure at the cable ends can be made, for example, by a metallic connecting spike that is pushed or screwed axially into the end face of the cable core in order to make electrical contact with the high-voltage cable. Other connection technologies such as, e.g., insulation displacement connections or clamped connections, can also be used.

The present disclosure also includes the innovative use of such a high-voltage cable as disclosed herein for electrostatically charging a coating agent in a coating plant, in particular in a paint shop for painting motor vehicle body components and for coating components in the supplier sector and industry in general.

Finally, the disclosure also includes an apparatus for electrostatically charging a coating agent, which apparatus can be used, for example, in a paint shop in order to charge electrostatically the coating agent (e.g. paint, powder coating) to be applied.

The apparatus according to the disclosure for charging a coating agent first has a high-voltage generator, which generates the necessary high voltage for charging the coating agent. In addition, the apparatus according to the disclosure for charging a coating agent comprises a high-voltage electrode in order to charge electrostatically the coating agent to be applied. Such high-voltage electrodes are known per se from the prior art and can, for instance, be in the form of external electrodes of a rotary atomizer. The disclosure also includes the option of direct charging inside a rotary atomizer.

In the apparatus according to the disclosure for charging a coating agent, the electrical connection between the high-voltage generator and the high-voltage electrode is made at least along some of the connection length by the high-voltage cable according to the disclosure as described above.

DRAWINGS

Other advantageous developments of the disclosure are characterized are explained in greater detail below with reference to the description of exemplary embodiments in conjunction with the figures, in which.

DETAILED DESCRIPTION

Figure 2:
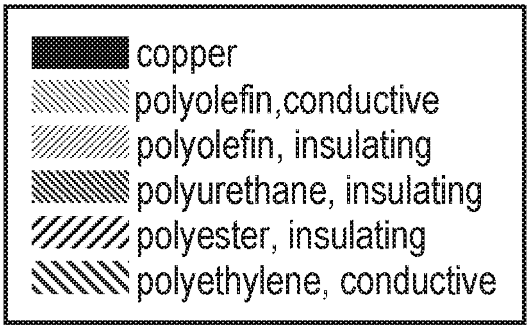
Fig. 2 Prior art
FIG. 2 is a cross-sectional view of a conventional high-voltage cable containing an electrically insulating cable core having an electrically conductive coating.
Figure 2:
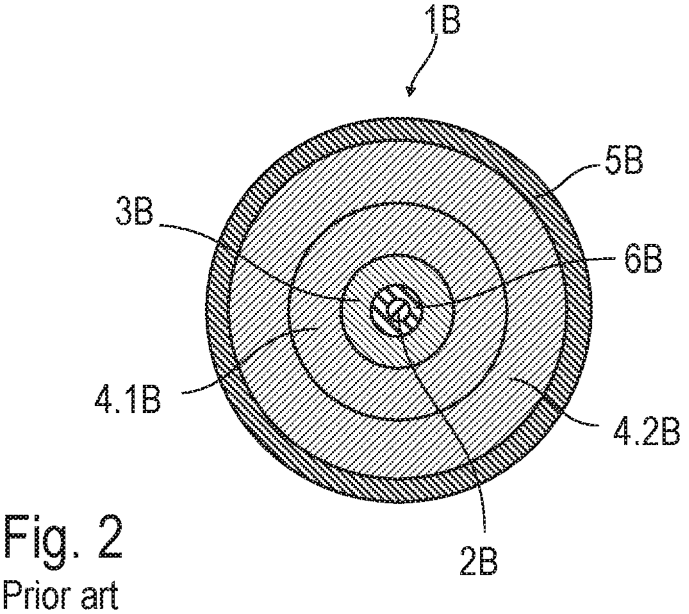
Fig. 2 Prior art
Figure 3:
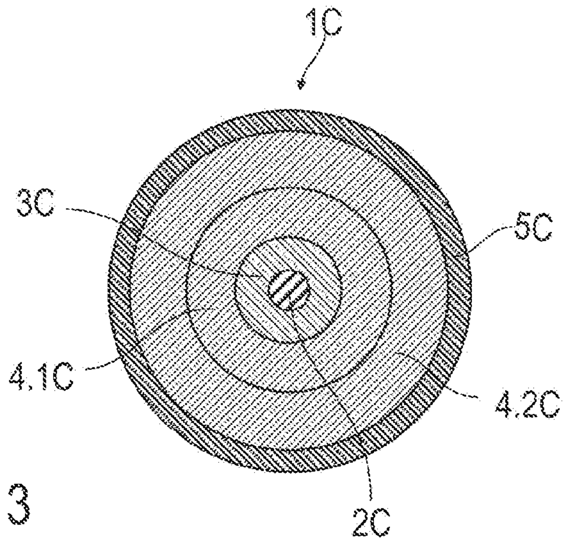
FIG. 3 is a cross-sectional view of a high-voltage cable according to the principles of the present disclosure containing an electrically conductive cable core.

FIG. 3 shows an exemplary embodiment of a high-voltage cable 1C according to the disclosure, which corresponds in part to the high-voltage cable 1B described above and depicted in FIG. 2, and therefore to avoid repetition, reference is made to the above description, with the similarly numbered reference signs being used for corresponding features.

A distinct feature of this exemplary embodiment according to the present disclosure is the design and construction of the cable core 2C. The cable core 2C here consists of twisted strips of nonwoven fabric, which each consist of a plurality of filaments (fibers) and are made electrically conductive. Thus the cable core 2C is made of a plastics material as a support material, which is made electrically conductive, for instance by filling or coating with carbon particulates. Thus the cable core 2C has a moderate electrical resistance in the range of, e.g., 10 kWm-100 kWm.

Forming the cable core 2C from twisted strips of nonwoven fabric, in contrast with the conventional high-voltage cable 1B shown in FIG. 2, inhibits the permeating petroleum jelly from affecting the electrical conductivity of the high-voltage cable 1C.

Figure 1:
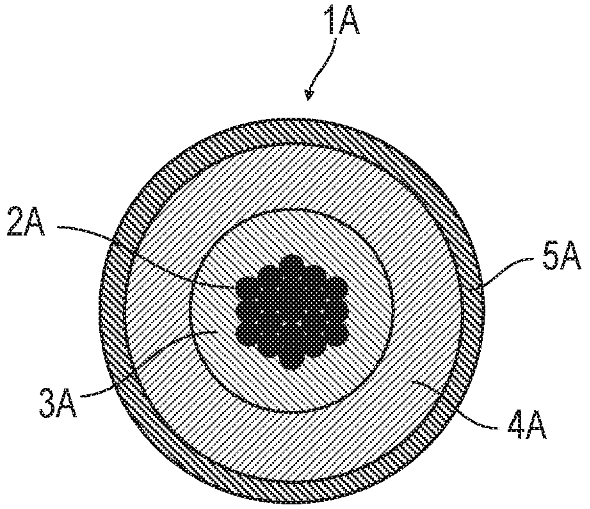
Fig. 1 Prior Art
FIG. 1 is a cross-sectional view of a conventional high-voltage cable containing a cable core made of copper.

The moderate electrical resistance of the cable core 2C, in contrast with the conventional high-voltage cable 1A shown in FIG. 1, prevents excessive current oscillations arising during discharge processes in an electrostatic coating plant.

Figure 4:
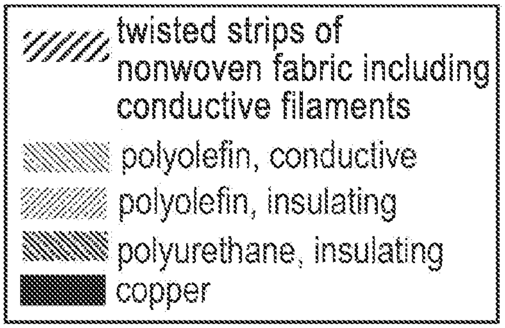
FIG. 4 is a cross-sectional view of an alternative high-voltage cable according to the principles of the present disclosure comprising an additional shield.
Figure 4:
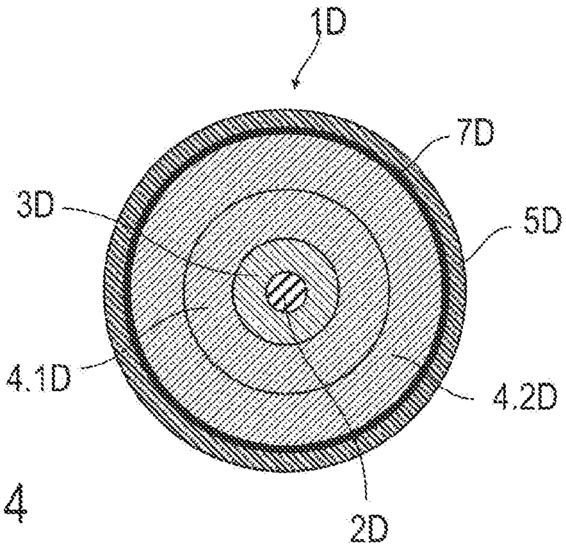

FIG. 4 shows another exemplary embodiment of a high voltage cable 1D according to the present disclosure, and therefore, to avoid repetition, reference is made to the above description, with the similarly numbered reference signs being used for corresponding features.

A distinct feature of this exemplary embodiment is that a shield 7D, which can be made of braided copper wire, is additionally arranged between the outer jacket 5D and the outer layer 4.2D of the insulating jacket.

Figure 5:
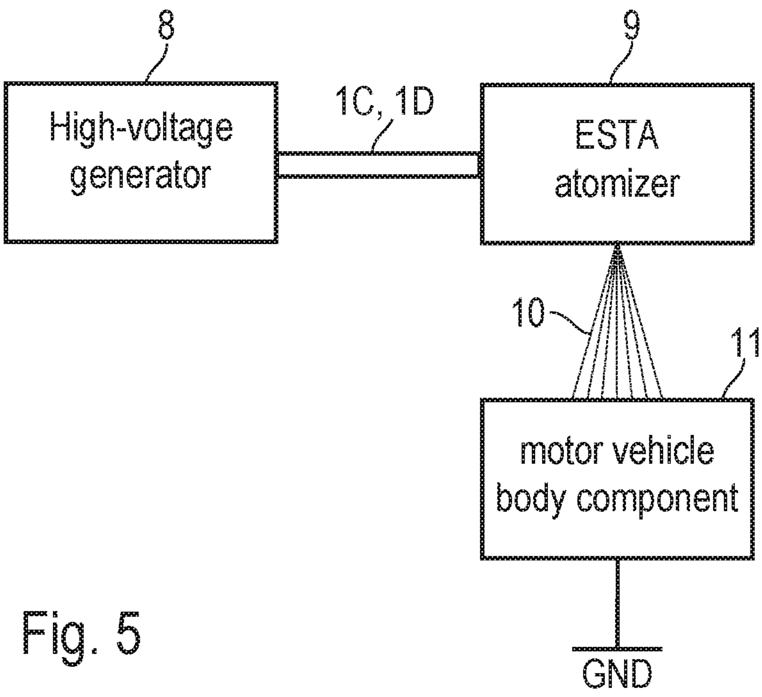
FIG. 5 is a schematic diagram of an apparatus according to the disclosure for charging a coating agent.
Figure 6:
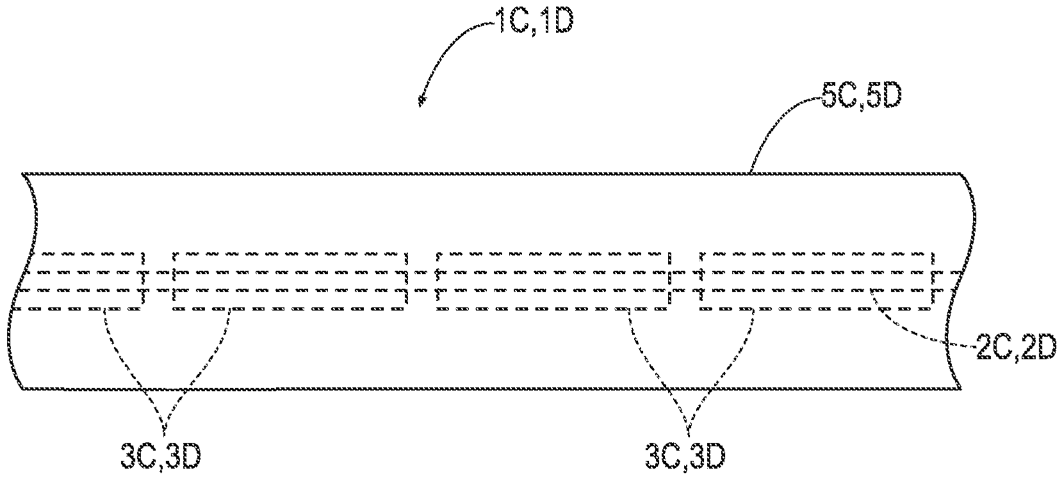
FIG. 6 is a side view of the high-voltage cable including a field-smoothing element surrounding the cable core at junctions along the high-voltage cable.

Finally, FIG. 5 schematically shows in an apparatus according to the disclosure for charging a coating agent, which apparatus comprises a high-voltage generator 8, which is connected via the high-voltage cable 1 according to the disclosure to an electrostatic atomizer 9, as known from the prior art.

The electrostatic atomizer 9 emits a spray jet 10 of electrostatically charged coating agent (e.g. paint) onto an electrically grounded motor vehicle body component 11.

The moderate electrical resistance of the high-voltage cable 1 advantageously prevents excessive current oscillations arising during discharge processes.

The above-described constructions of the high-voltage cables 1C, 1D provide that permeating petroleum jelly does not modify or even result in a drop in the electrical conductivity of the high-voltage cables 1C, 1D.

The disclosure is not restricted to the exemplary embodiments described above. Numerous variants and variations are possible according to the principles of the present disclosure. Accordingly, it is to be understood that the above description is intended to be illustrative and not restrictive. Many embodiments and applications other than the examples provided would be apparent to those of skill in the art upon reading the above description. The scope of the disclosure should be determined, not with reference to the above description, but should instead be determined with reference to claims appended hereto and/or included in a non provisional patent application based hereon, along with the full scope of equivalents to which such claims are entitled.

It is anticipated and intended that future developments will occur in the arts discussed herein, and that the disclosed systems and methods will be incorporated into such future embodiments. In sum, it should be understood that the disclosed subject matter is capable of modification and variation.

The invention claimed is:

1. A high-voltage cable for charging a coating agent in an electrostatic coating plant, the cable comprising:

a radially central cable core consisting of a plurality of twisted strips of nonwoven fabric, each strip of nonwoven fabric composed of a plurality of electrically conductive filaments, the cable core having an electrical resistance in the range of 10 kΩ/m-100 kΩ/m;

a first electrically insulating jacket layer sheathing the cable core;

an electrical shield layer surrounding the first electrically insulating jacket layer, the electrical shield layer having an electrical resistance less than the electrical resistance of the cable core; and a field smoothing element sheathing the cable core at junctions spaced from each other along the cable, the field-smoothing element arranged between the cable core and the first electrically insulating jacket layer, the field-smoothing element lying directly on the twisted strips of the cable core.

2. The high-voltage cable of claim 1, wherein the filaments each include an electrically insulating material impregnated with electrically conductive carbon, the fabric having a moderate electrical resistance configured for use in an electrostatic coating plant for electrostatically charging a coating agent.

3. The high-voltage cable of claim 1, wherein at least part of the filament is made of an electrically conductive plastics material.

4. The high-voltage cable of claim 1, wherein the nonwoven fabric strips of the cable core are configured with a coarseness for providing gaps therebetween, respectively, the gaps substantially limiting capillary forces thereat to be substantially insufficient to draw petroleum jelly into the gaps.

5. The high-voltage cable of claim 1, wherein the nonwoven fabric strips are twisted sufficiently tightly to be substantially free of gaps between the strips thereof.

6. The high-voltage cable of claim 1, wherein the field-smoothing element is made of a plastics material.

7. The high-voltage cable according to claim 6, wherein the plastics material is polyolefin.

8. The high-voltage cable of claim 1, wherein the field-smoothing element has a moderate electrical resistance configured for use in an electrostatic coating plant for electrostatically charging a coating agent, and the electrical resistance of the field-smoothing element is greater than the electrical resistance of the cable core, and the electrical resistance of the field-smoothing element is less than an electrical resistance of the first electrically insulating jacket layer.

9. The high-voltage cable of claim 1, further comprising: an electrically insulating outer jacket sheathing the cable core, the first electrically insulating jacket layer and the electrical shield layer.

10. The high-voltage cable according to claim 9, wherein the outer jacket is made of a plastics material.

11. The high-voltage cable of claim 1, wherein the first electrically insulating jacket layer is made of a plastics material, and the cable includes a second electrically insulating jacket layer coaxial to the first electrically insulating jacket layer.

12. The high-voltage cable of claim 1, wherein one or more of the plurality of electrically conductive filaments abut the field smoothing element.

* * * * *